(12) United States Patent
Chiba et al.

(10) Patent No.: US 6,337,161 B2
(45) Date of Patent: *Jan. 8, 2002

(54) MASK STRUCTURE EXPOSURE METHOD

(75) Inventors: Keiko Chiba; Hideo Kato, both of Utsunomiya; Hiroshi Maehara, Yokohama, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/161,372

(22) Filed: Sep. 28, 1998

(30) Foreign Application Priority Data

Oct. 1, 1997 (JP) .............................. 9-268862

(51) Int. Cl.[7] ................................. G03F 9/00
(52) U.S. Cl. ............................. 430/5; 428/14
(58) Field of Search ...................... 430/5, 311; 428/14

(56) References Cited

U.S. PATENT DOCUMENTS

| | | | |
|---|---|---|---|
| 4,677,042 A | 6/1987 | Kato et al. ............ | 430/5 |
| 4,735,877 A | 4/1988 | Kato et al. ............ | 430/5 |
| 4,837,123 A | 6/1989 | Kato et al. ............ | 430/269 |
| 4,996,106 A | * 2/1991 | Nakagawa et al. ...... | 428/343 |
| 5,422,921 A | 6/1995 | Chiba ................... | 378/34 |
| 5,553,110 A | 9/1996 | Sentoku et al. ........ | 378/35 |
| 5,781,607 A | * 7/1998 | Acosta et al. .......... | 378/34 |
| 5,809,103 A | * 7/1998 | Smith et al. ........... | 378/35 |
| 5,792,578 A | * 8/1998 | Tzu et al. .............. | 430/5 |
| 5,793,836 A | * 8/1998 | Maldonado et al. ..... | 378/35 |
| 5,928,813 A | * 7/1999 | Krivokapic et al. .... | 430/5 |
| 5,958,631 A | * 9/1999 | Acosta et al. .......... | 430/5 |

* cited by examiner

Primary Examiner—Mark F. Huff
Assistant Examiner—Saleha R. Mohamedulla
(74) Attorney, Agent, or Firm—Fitzpatrick, Cella, Harper & Scinto

(57) ABSTRACT

A mask structure to be used for X-ray exposure or the like in manufacturing semiconductor devices prevents contaminants from adhering and accumulating on the surface of a mask, thereby extending the life of the mask. In this mask structure, titanium oxide films are formed on front and back pellicles that protect a mask, composed of a support film and an X-ray absorber, from dust or the like. Titanium oxide decomposes contaminants by functioning as a photocatalyst, and prevents the adhesion and accumulation of contaminants by an antistatic function based on photoconductivity. When a titanium oxide film is formed on the surface of the mask itself, it is preferable that the film be formed outside the exposure area or the like.

11 Claims, 5 Drawing Sheets

MASK STRUCTURE EXPOSURE METHOD

BACKGROUND OF THE INVENTION

1. Field of the Invention

The present invention relates to a mask structure for use in forming a desired pattern on a substrate, such as a semiconductor substrate, an exposure method and an apparatus for forming the pattern by using the mask structure, a semiconductor device manufactured by using the mask structure, and a semiconductor device manufacturing method.

2. Description of the Related Art

In manufacturing a device having fine patterns formed thereon, for example, a semiconductor device such as a semiconductor integrated circuit, a micromachine, or a thin-film magnetic head, generally, a desired pattern is formed on a substrate, which serves as a material to be patterned, by radiating light (e.g., visible light, ultraviolet rays, X-rays or the like) onto the substrate via a mask. In manufacturing, for example, a semiconductor integrated circuit, a mask is prepared, the mask corresponding to a desired circuit pattern to be formed on the semiconductor substrate, and the semiconductor substrate, having a resist thereon, is irradiated with light such as X-rays, via the mask. The resist on the substrate is selectively exposed, and the circuit pattern is transferred thereon. Through subsequent etching and film-deposition processes, a desired circuit is formed on the semiconductor substrate. A description will be given below of the manufacturing of the aforementioned device, having fine patterns, with reference to an example in which a semiconductor integrated circuit is formed.

With the recent increases in the density and the operating speed of semiconductor integrated circuits, the line width of integrated circuit patterns has decreased, and conventional semiconductor manufacturing methods need to have a higher performance. For that purpose, under development as a printing apparatus (e.g., an exposure apparatus) is a stepper, which uses exposure light having a shorter wavelength than before, such as light from a KrF excimer laser having a wavelength of 248 nm, light from an ArF excimer laser having a wavelength of 193 nm, or X-rays having a wavelength of 0.2 nm to 15 nm. Furthermore, a chemically amplified resist using an acid catalyst is finding increased use as a resist in transferring a desired pattern onto a material to be patterned.

As the patterns become finer, it will be increasingly difficult to protect against dust generated in the processing. The limitations on the size and amount of normal refuse are becoming more strict, and the sensitivity in processing chemical substances is increasing. Semiconductor integrated circuits are fabricated in a clean room environment, and chemical contamination seriously affects that environment. Chemical contamination is caused by products being decomposed from a resist, substances being produced in resist developing and cleaning processes, adhesives used for the mask, and volatile substances from fixtures, such as the material on walls of the equipment being used.

When exposure is performed for a long time with short-wavelength light, such as far-ultraviolet light or X-rays, in such a chemically contaminated environment, the contamination of the mask surface, namely, deposits thereon, changes the transmittance, reflectance, and scattering properties of the mask. In particular, when a chemically amplified resist is used, an acid generator or acid, and decomposition products evaporate during or after exposure, which accelerates the contamination of the mask. Above all, contamination of the mask is a serious problem in projection exposure using X-rays or the like, because a material to be patterned is spaced from the mask by only several tens of micrometers or less. While these deposits seem to depend on the processing environment, they are not uniform in shape or composition, and the details thereof are not clear. It may be conjectured that the deposits are not produced by a simple photochemical reaction, but by complicated actions of the processes of decomposition, recombination, multi-dimensional reaction, accumulation, crystallization, and the like. Though it may be possible to remove the deposits by cleaning, the cleaning is considerably difficult, particularly in an X-ray mask, since an absorber is shaped with a high aspect ratio (i.e., the height is smaller than the width), and not all deposits can be removed by cleaning. Further, support film in an X-ray mask is weak, because of its small thickness. Therefore, the number of times of cleaning of the mask itself needs to be reduced.

SUMMARY OF THE INVENTION

Accordingly, it is an object of the present invention to provide a mask structure in which the number of times of cleaning of a mask is reduced or the need for cleaning is eliminated altogether by preventing contaminants from adhering and accumulating onto the mask surface, so that the life of the mask is thereby extended, and to provide an exposure method and apparatus, a semiconductor device, and a semiconductor device manufacturing method using the mask structure.

In order to achieve the above object, the present invention provides a mask structure including a mask for use in transferring a desired pattern onto a substrate by exposure, a pellicle positioned to cover at least one of a patterned surface of the mask and a surface of the mask opposite to the patterned surface, and a titanium oxide film formed on the surface of the pellicle.

The mask may be a reflective type or a transmission mask.

Preferably, the titanium oxide film is formed on a section of the surface of the pellicle other than a section where light is radiated when the substrate is exposed.

The mask structure is used for exposure using X-rays.

The present invention provides an exposure method including the steps of providing a mask structure having a mask with a desired pattern, a pellicle positioned to cover at least one of a patterned surface of the mask and a surface of the mask opposite to the patterned surface, and a titanium oxide film formed on the surface of the pellicle, and transferring the pattern on the mask onto a material to be patterned by exposure.

Preferably, the transfer by exposure is performed by using a chemically amplified resist on the material to be patterned.

Preferably, the transfer by exposure is performed with X-rays.

The present invention also provides an exposure apparatus for transferring by exposure a pattern on a mask in a mask structure onto a material to be patterned, the mask structure including the mask, and a pellicle positioned to cover at least one of a patterned surface of the mask and a surface of the mask opposite to the patterned surface, the exposure apparatus including mask structure holding means for holding the mask structure, wherein the mask structure has a titanium oxide film formed on the surface of the pellicle, and means for holding the material to be patterned.

The exposure apparatus may further include an auxiliary light source for radiating auxiliary light to the mask structure without affecting the material to be patterned.

The exposure apparatus may further include a mask cassette for storing the mask structure when the material to be patterned is not subjected to exposure, and an auxiliary light source for radiating auxiliary light to the mask structure stored in the mask cassette.

The present invention also provides a semiconductor device manufactured by transferring by exposure a pattern on a mask in a mask structure onto a material to be patterned and processing the patterned material, the mask structure including the mask, a pellicle positioned to cover at least one of a patterned surface of the mask and a surface of the mask opposite to the patterned surface, and a titanium oxide film formed on the surface of the pellicle.

The present invention also provides a semiconductor device manufacturing method including the steps of providing a mask structure having a mask with a desired pattern, a pellicle positioned to cover at least one of a patterned surface of the mask and a surface of the mask opposite to the patterned surface, and a titanium oxide film formed on the surface of the pellicle, transferring by exposure the pattern on the mask onto a material to be patterned, and processing the patterned material.

The present invention also provides a mask structure including a mask for use in transferring a desired pattern onto a substrate by exposure, the mask having an exposure area to be irradiated with an energy beam, and a titanium oxide film formed on the surface of the mask, the titanium oxide film being formed outside the exposure area.

The energy beam may include X-rays.

The present invention also provides an exposure method including the steps of providing a mask structure including a mask with a desired pattern and an exposure area to be irradiated with an energy beam, and a titanium oxide film formed on the surface of the mask, the titanium oxide film being formed outside the exposure area, and transferring by exposure the pattern on the mask onto a material to be patterned.

Preferably, the transfer by exposure is performed by using a chemically amplified resist on the material to be patterned.

Preferably, the transfer by exposure is performed with X-rays.

The present invention also provides an exposure apparatus for transferring by exposure a pattern on a mask in a mask structure onto a material to be patterned, the mask structure having the mask with the pattern and an exposure area to be irradiated with an energy beam, the exposure apparatus including mask structure holding means for holding the mask structure, wherein the mask structure has a titanium oxide film formed on the surface of the mask, and the titanium oxide film is formed outside the exposure area, and means for holding the material to be patterned.

The exposure apparatus may further include an auxiliary light source for radiating auxiliary light to the mask structure without affecting the material to be patterned.

The exposure apparatus may further include a mask cassette for storing the mask structure when the material to be patterned is not subjected to exposure, and an auxiliary light source for radiating auxiliary light to the mask structure stored in the mask cassette.

The present invention also provides a semiconductor device manufactured by transferring by exposure a pattern on a mask in a mask structure onto a material to be patterned and processing the patterned material, the mask structure including the mask having the pattern and an exposure area to be irradiated with an energy beam, and a titanium oxide film formed on the surface of the mask, the titanium oxide film being formed outside the exposure area.

The present invention also provides a semiconductor device manufacturing method, including the steps of providing a mask structure including a mask having a pattern and an exposure area to be irradiated with an energy beam, and a titanium oxide film formed on the surface of the mask, the titanium oxide film being formed outside the exposure area, transferring by exposure the pattern on the mask onto a material to be patterned, and processing the patterned material.

The present invention also provides a mask structure including a mask for use in transferring a desired pattern onto a substrate by exposure, the mask having a film and an absorber pattern formed on the film to be irradiated with an energy beam, and a titanium oxide film formed on the mask, the titanium oxide film being formed on the surface of the film and on the surface of the absorber pattern, which surface excludes the sides of the absorber pattern.

The energy beam may include X-rays.

The present invention also provides an exposure method including the steps of providing a mask structure including a mask with a desired pattern that has a film and an absorber pattern formed on the film, to be irradiated with an energy beam, and a titanium oxide film formed on the mask, the titanium oxide film being formed on the surface of the film and on the surface of the absorber pattern, which surface excludes the sides of the absorber pattern, and transferring by exposure the pattern on the mask onto a material to be patterned.

Preferably, the transfer by exposure is performed by using a chemically amplified resist on the material to be patterned.

Preferably, the transfer by exposure is performed with X-rays.

The present invention also provides an exposure apparatus for transferring by exposure a pattern on a mask in a mask structure onto a material to be patterned, the mask structure including the mask with the pattern that has a film and an absorber pattern formed on the film to be irradiated with an energy beam, the exposure apparatus including mask structure holding means for holding the mask structure, wherein the mask structure has a titanium oxide film formed on the mask, the titanium oxide film being formed on the surface of the film and on the surface of the absorber pattern, which surface excludes the sides of the absorber pattern, and means for holding the material to be patterned.

The exposure apparatus may further include an auxiliary light source for radiating auxiliary light to the mask structure without affecting the material to be patterned.

The exposure apparatus may further include a mask cassette for storing the mask structure when the material to be patterned is not subjected to exposure, and an auxiliary light source for radiating auxiliary light to the mask structure stored in the mask cassette.

The present invention also provides a semiconductor device manufactured by transferring by exposure a pattern on a mask in a mask structure onto a material to be patterned and processing the patterned material, the mask structure including the mask with the desired pattern that has a film and an absorber pattern formed on the film to be irradiated with an energy beam, and a titanium oxide film formed on the mask, the titanium oxide film being formed on the surface of the film and on the surface of the absorber pattern, which surface excludes the sides of the absorber pattern.

The present invention also provides a semiconductor device manufacturing method including the steps of providing a mask structure including a mask with a desired pattern that has a film and an absorber pattern formed on the film to be irradiated with an energy beam, and a titanium oxide film formed on the mask, the titanium oxide film being formed on the surface of the film and on the surface of the absorber pattern, which surface excludes the sides of the absorber pattern, transferring by exposure the pattern on the mask onto a material to be patterned, and processing the patterned material.

The present invention also provides a mask structure including a mask for use in transferring a desired pattern onto a substrate, the mask including an exposure area to be irradiated with an energy beam, and an absorber pattern for the energy beam being formed on the exposure area, and a titanium oxide film formed on the mask, the titanium oxide film being formed outside the exposure area and only on the upper surface of the absorber pattern.

The energy beam may include X-rays.

The present invention also provides an exposure method including the steps of providing a mask structure having a mask with a pattern, the mask including an exposure area to be irradiated with an energy beam, and an absorber pattern for the energy beam being formed on the exposure area, and a titanium oxide film formed on the mask, the titanium oxide film being formed outside the exposure area and only on the upper surface of the absorber pattern, and transferring by exposure the pattern on the mask onto a material to be patterned.

Preferably, the transfer by exposure is performed by using a chemically amplified resist on the material to be patterned.

Preferably, the transfer by exposure is performed with X-rays.

The present invention also provides an exposure apparatus for transferring by exposure a pattern on a mask in a mask structure onto a material to be patterned, the mask structure including the mask having a pattern, an exposure area to be irradiated with an energy beam and an absorber pattern for the energy beam formed on the exposure area, and a titanium oxide film formed on the mask, the titanium oxide film being formed outside the exposure area and only on the upper surface of the absorber pattern, the exposure apparatus including mask structure holding means for holding the mask structure, and means for holding the material to be patterned.

The exposure apparatus may further include an auxiliary light source for radiating auxiliary light to the mask structure without affecting the material to be patterned.

The exposure apparatus may further include a mask cassette for storing the mask structure when the material to be patterned is not subjected to exposure, and an auxiliary light source for radiating auxiliary light to the mask structure stored in the mask cassette.

The present invention also provides a semiconductor device manufactured by transferring by exposure a pattern on a mask in a mask structure onto a material to be patterned and processing the patterned material, wherein the mask structure includes the mask having the pattern, an exposure area to be irradiated with an energy beam and an absorber pattern for the energy beam formed on the exposure area, and a titanium oxide film formed on the mask, the titanium oxide film being formed outside the exposure area and only on the upper surface of the absorber pattern.

The present invention also provides a semiconductor device manufacturing method including the steps of providing a mask structure including a mask having a pattern, an exposure area to be irradiated with an energy beam and an absorber pattern formed on the exposure area for the energy beam, and a titanium oxide film formed on the mask, the titanium oxide film being formed outside the exposure area and only on the upper surface of the absorber pattern, transferring by exposure the pattern on the mask onto a material to be patterned, and processing the patterned material.

The present invention also provides an exposure apparatus for transferring by exposure a desired pattern on a mask in a mask structure onto a material to be patterned, the mask structure including the mask covered or not covered with a pellicle, and a titanium oxide film formed thereon, the exposure apparatus including a first chamber in which the pattern is transferred onto the material to be patterned through exposure by using the mask structure, and a second chamber containing an auxiliary light source for irradiating the titanium oxide film to cause the titanium oxide film to act as a photocatalyst.

Preferably, the second chamber is used to store the mask structure.

Further objects, features and advantages of the present invention will become apparent from the following description of the preferred embodiments with reference to the attached drawings.

DESCRIPTION OF THE PREFERRED EMBODIMENTS

Figure 1:
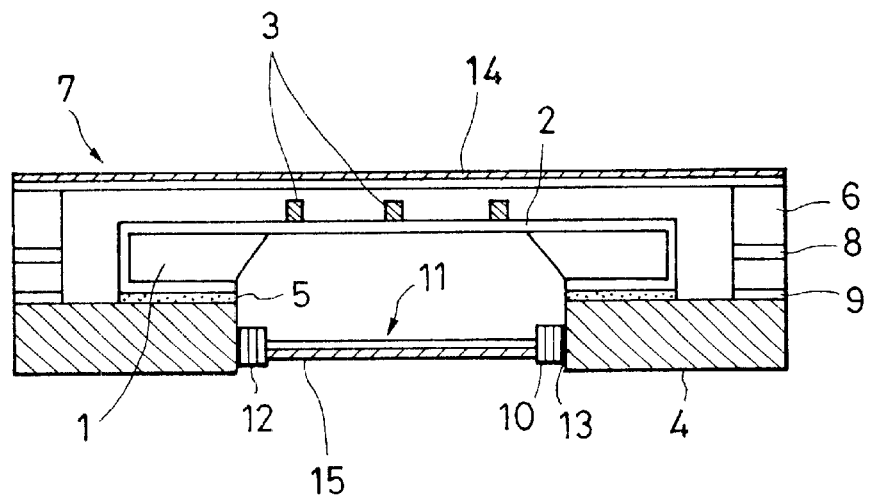
FIG. 1 is a cross-sectional view showing the configuration of a mask structure according to a first embodiment of the present invention.

From a study of the countermeasures for preventing the adhesion and accumulation of contaminants onto the surface of a mask, with repeated trial and error, the present inventors have found that the above-mentioned problems can be solved by forming a thin film of titanium oxide on the surface of the mask or the surface of a pellicle mounted on the mask.

In a mask structure according to the preferred embodiments of the present invention, which will be described later, a titanium oxide film may be formed on the part of the mask or the pellicle other than the part that is irradiated with light for exposing a substrate. While the mask structure of the present invention is of a type used for X-ray exposure, it may be a mask structure for use with exposure techniques using light other than X-rays.

In the following embodiments, the titanium oxide film may be formed on the surface of the mask or the pellicle by, for example, evaporation, or a method of heating and hydrolyzing alkyl titanate, which has been previously applied.

Titanium oxide typically functions as a photocatalyst when irradiated with light having short wavelengths, such as ultraviolet rays and X-rays, and chemically decomposes various types of substances. Titanium oxide is also effective as a photoconductor. When irradiated, titanium oxide is made conductive and serves an antistatic function, thereby preventing the adhesion of contaminants. Namely, when the surface of the pellicle is provided with a titanium oxide thin film, it is prevented from being contaminated by the decomposition and antistatic functions of the titanium oxide. This makes it possible to reduce the number of times of replacing the pellicle and cleaning of the mask or to eliminate the need for such replacing and cleaning, and to thereby extend the life of the mask. Similarly, when the surface of the mask is provided with a titanium oxide thin film, it is prevented from being contaminated by the decomposition and antistatic functions of the titanium oxide, which makes it possible to reduce the number of times of cleaning of the mask or to eliminate the need for cleaning altogether, thereby extending the life of the mask.

According to an exposure method and apparatus in which a desired pattern is transferred onto a material to be patterned by exposure using such a mask structure, it is possible to achieve high-accuracy printing that is suitable for mass production without any influence of mask contamination. In addition, high-performance semiconductor devices can be mass-produced by transferring a desired pattern onto a substrate to be processed through exposure using this mask structure, and processing the substrate.

The preferred embodiments of the present invention will now be described with reference to the attached drawings. In general, the first to third embodiments relate to a mask structure in which a titanium oxide thin film is formed on the surface of a pellicle for preventing mask contamination, the fourth to sixth embodiments relate to a mask structure in which a titanium oxide thin film is formed on the surface of a mask, the seventh embodiment relates to an X-ray exposure apparatus using the mask structure of the present invention, and the eighth embodiment relates to the manufacturing of a semiconductor device with the X-ray exposure apparatus of the seventh embodiment.

<First Embodiment>

FIG. 1 is a cross-sectional view of a mask structure according to a first embodiment of the present invention. This mask structure is an X-ray mask structure that is suitable for X-ray exposure.

This X-ray mask structure comprises a holding frame 1 made of Si (silicon) and having a thickness of 2 mm, an X-ray transmissive support film 2 made of SiC having a thickness of 2.0 $\mu$m that is held by the holding frame 1 and formed by CVD (chemical vapor deposition), an X-ray absorber 3 made of a Ta (tantalum) film that is formed on the support film 2 by sputtering and processed into a desired pattern, and a reinforcing member 4, made of SiC, which is bonded to the holding frame 1 with an adhesive 5.

A front pellicle 7 (placed on the side of a material to be patterned such as a semiconductor substrate), bonded onto a frame 6, is detachably mounted on the reinforcing member 4 with a pressure-sensitive adhesive 9 so that it is spaced from the support film 2 by 5 $\mu$m. The frame 6 is made of Al (aluminum), and is provided with holes 8 for pressure adjustment. Each of the pressure-adjustment holes 8 has a filter (not shown) for preventing the entry of dust. The front pellicle 7 is made of polyimide having a thickness of 0.8 $\mu$m, and its flatness is controlled to 1 $\mu$m or less. On the front pellicle 7, a titanium oxide film 14 having a thickness of 20 nm is formed by resistance heating evaporation or EB (electron beam) evaporation. Preferably, the titanium oxide film 14 has the smallest possible thickness that ensures its function as a photocatalyst, in order to reduce the absorption of X-rays. Specifically, a preferable thickness ranges from about 10 nm to about 100 nm.

On the side of the reinforcing member 4, a back pellicle 11, bonded to a frame 10, is detachably mounted with a pressure-sensitive adhesive 13 so that it is spaced from the support film 2 by 5 mm. The frame 10 is made of Al, and is provided with holes 12 for pressure adjustment. Each of the holes 12 has a filter (not shown) for preventing the entry of dust. The back pellicle 11 is made of polyimide having a thickness of 0.8 $\mu$m, similar to the front pellicle 7, and has a titanium oxide film 15 having a thickness of 20 nm on its surface.

The titanium oxide films 14 and 15 of the pellicles 7 and 11, respectively, function as photocatalysts during X-ray exposure, as mentioned above. In addition, they also function as photocatalysts when being irradiated with auxiliary light (e.g., light from a mercury lamp, a black light or the like) without affecting the material to be patterned (i.e., a wafer), thereby decomposing contaminants adhering to the pellicles 7 and 11. By way of example, this mask structure may be irradiated with auxiliary light in a mask cassette during storage. Titanium oxide can maintain its function as a photocatalyst with respect to ambient room light from a fluorescent lamp or the like.

Furthermore, titanium oxide is photoconductive, and is made conductive by the aforementioned exposure or radiation of auxiliary light, thereby preventing dust and the like from adhering to the polyimide that forms the pellicle. Since the titanium oxide film on the pellicle is less strictly required to have resistance to exposure than an antistatic film directly formed on the mask, the setting of its film deposition conditions is easy. In addition, the support film 2 may become broken, because it is inorganic. Nevertheless, if it becomes broken, the pellicle film also serves as a shatter-proof film. This is an added benefit.

The decomposition and antistatic functions of the titanium oxide mentioned above make it possible to prevent the surfaces of the mask and the pellicle from being contaminated, and to reduce the number of times of replacing the pellicle and cleaning of the mask, or to eliminate the need for replacing and cleaning altogether. Thereby, it is possible to extend the life of the mask, and to provide an X-ray mask structure that is suitable for mass production.

<Second Embodiment>

Figure 2:
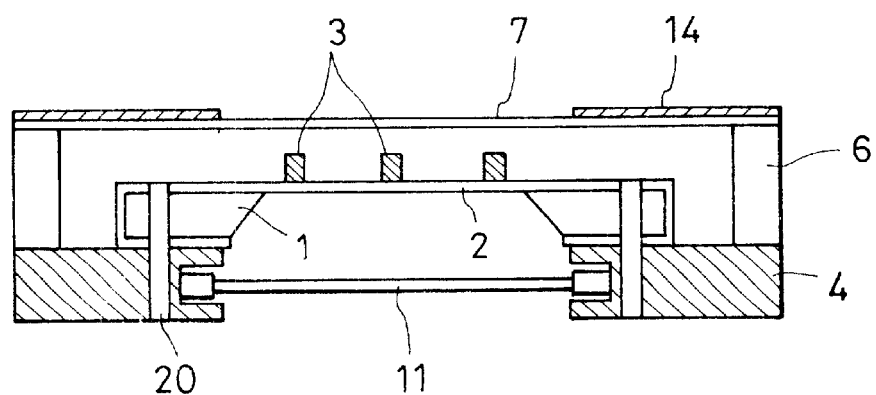
FIG. 2 is a cross-sectional view showing the configuration of a mask structure according to a second embodiment of the present invention.

FIG. 2 is a cross-sectional view of a mask structure according to a second embodiment of the present invention. This mask structure is an X-ray mask structure that is suitable for X-ray exposure.

This X-ray mask structure comprises a holding frame 1 having a thickness of 2 mm, which is made of Si, an X-ray transmissive support film 2 made of SiN having a thickness of 2.0 μm, which is held by the holding frame 1 and formed by CVD, an X-ray absorber 3 made of a W (tungsten) film that is formed on the support film 2 and processed into a desired pattern, and a reinforcing member 4 made of borosilicate glass (trade name: Pyrex) and bonded to the holding frame 1 by anode coupling. The X-ray mask structure has a front pellicle 7 and a back pellicle 11 similar to the X-ray mask structure of the first embodiment. The front and back pellicles 7 and 11 are made of polyphenylene sulfide, which is an electroconductive and radiation-resistant polymer. Holes 20 for pressure adjustment are formed so that they penetrate through the reinforcing member 4 and the holding frame 1. A titanium oxide film 14 having a thickness of 100 nm is formed on only the peripheral section (i.e., the section outside the exposure area) of the front pellicle 7 by applying and baking alkyl titanate. In general, there are few deposits on the back side. Therefore, the back pellicle 11 may have no titanium oxide film, as shown in FIG. 2, or may have a titanium oxide film (not shown), similar to the first embodiment.

As mentioned above, the titanium oxide film 14 formed on the front pellicle 7 functions as a photocatalyst when irradiated with auxiliary light (e.g., light from a mercury lamp, a black light or the like) without affecting a material to be patterned (i.e., a wafer), thereby decomposing contaminants adhering to the front pellicle 7. For example, this mask structure may be irradiated with auxiliary light in a mask cassette during storage. Titanium oxide can maintain its function as a photocatalyst with respect to ambient room light from a fluorescent lamp or the like.

In this embodiment, since the titanium oxide film 14 is formed outside the exposure area on the front pellicle 7, it can be given a thickness that is essential to and sufficient for the function as a photocatalyst, without causing the attenuation of X-rays due to absorption by titanium oxide, or a change in the titanium oxide due to irradiation with X-rays.

The decomposition and antistatic functions of titanium oxide mentioned above make it possible to prevent the surfaces of the mask and the pellicle from being contaminated, and to reduce the number of times of replacing the pellicle and cleaning of the mask, or to eliminate the need for replacing and cleaning altogether. Thereby, it is possible to extend the life of the mask, and to provide an X-ray mask structure that is suitable for mass production.

<Third Embodiment>

Figure 3:
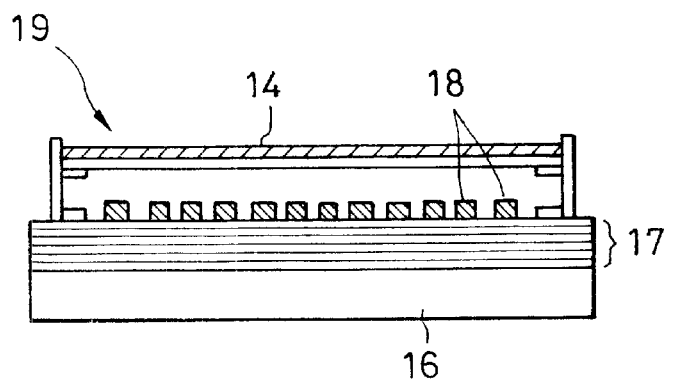
FIG. 3 is a cross-sectional view showing the configuration of a mask structure according to a third embodiment of the present invention.

FIG. 3 is a cross-sectional view of a mask structure according to a third embodiment of the present invention. This mask structure is an X-ray mask structure that is suitable for X-ray exposure.

This X-ray mask structure is a reflective mask comprising a quartz substrate 16, a reflective substrate 17 formed on the quartz substrate 16 and having a Mo (molybdenum)/Si multilayer structure (repeated multilayer structure), and a non-reflective pattern 18 made of tungsten (W) that is formed on the reflective substrate 17. In the reflective mask, a titanium oxide film cannot be formed directly on the surface of the mask, because it may change the reflectivity of the mask. Accordingly, in this embodiment, a titanium oxide film 14 is formed on a pellicle 19 that is detachable from the mask, and the X-ray mask structure undergoes exposure with the pellicle 19 detached therefrom. The pellicle 19 may be made of a polymeric material, or an inorganic material, such as glass.

In the X-ray reflective mask structure of this embodiment, the pellicle 19 is attached thereto during a non-operation state, so that the decomposition and antistatic functions of the titanium oxide make it possible to prevent the surface of the mask from being contaminated, to reduce the number of times of cleaning, or to eliminate the need for cleaning itself altogether, thereby extending the life of the mask. Thereby, it is possible to provide an X-ray reflective mask structure that is suitable for mass production.

<Fourth Embodiment>

Figure 4:
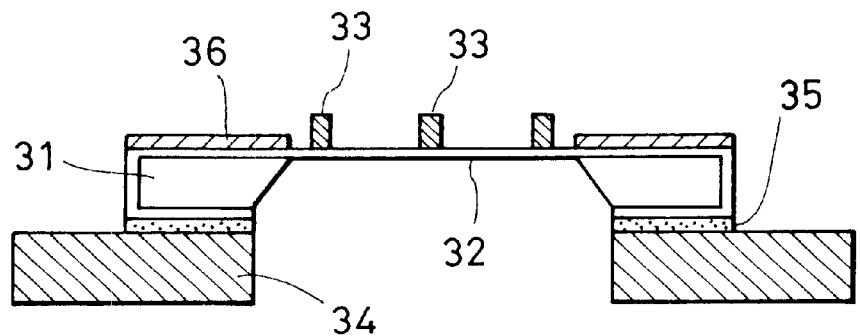
FIG. 4 is a cross-sectional view showing the configuration of a mask structure according to a fourth embodiment of the present invention.

FIG. 4 is a cross-sectional view of a mask structure according to a fourth embodiment of the present invention. This mask structure is an X-ray mask structure that is suitable for X-ray exposure.

This X-ray mask structure comprises a holding frame 31 made of Si and having a thickness of 2 mm, an X-ray transmissive support film 32 made of SiC and having a thickness of 2.0 μm, which is held by the holding frame 31 and formed by CVD, an X-ray absorber 33 formed of a tungsten (W) film on the support film 32 by sputtering and processed into a desired pattern, and a reinforcing member 34 made of SiC and bonded to the holding frame 31 with an adhesive 35.

A titanium oxide film 36, having a thickness of 100 nm, is formed on only the peripheral section (i.e., the section outside the exposure area) on the mask by applying and heating alkyl titanate thereon.

As mentioned above, the titanium oxide film 36 is formed on the mask, and it functions as a photocatalyst when irradiated with auxiliary light (e.g., light from a mercury lamp, a black light, or the like) without affecting a material to be patterned (i.e., a wafer), thereby decomposing contaminants adhering to the mask. For example, this mask structure may be irradiated with auxiliary light in a mask cassette during storage. Titanium oxide can maintain its function as a photocatalyst with respect to ambient room light from a fluorescent lamp or the like.

In this embodiment, since the titanium oxide film 36 is formed outside the exposure area on the mask, it can be given a thickness that is essential to and sufficient for the function as a photocatalyst, without causing attenuation of X-rays due to absorption by the titanium oxide, or a change in the titanium oxide due to irradiation with the X-rays. Moreover, the line width control by the X-ray absorber 33 remains easy.

The decomposition and antistatic functions of the titanium oxide mentioned above make it possible to prevent the mask surface from being contaminated, and to reduce the number of times of cleaning of the mask, or to eliminate the need for cleaning altogether. Thereby, it is possible to extend the life of the mask, and to provide an X-ray mask structure that is suitable for mass production.

<Fifth Embodiment>

Figure 5:
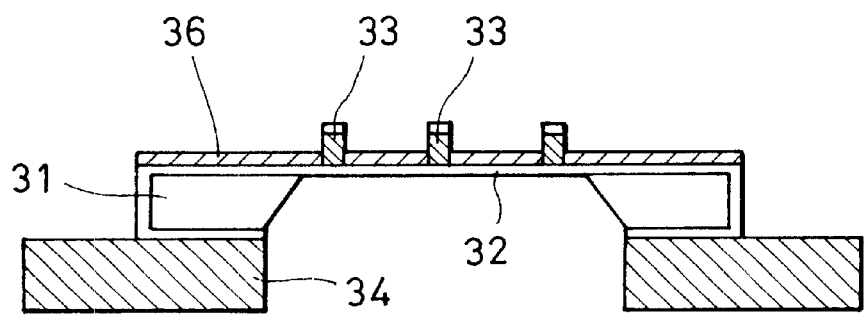
FIG. 5 is a cross-sectional view showing the configuration of a mask structure according to a fifth embodiment of the present invention.

FIG. 5 is a cross-sectional view of a mask structure according to a fifth embodiment of the present invention. This mask structure is an X-ray mask structure that is suitable for X-ray exposure.

In this X-ray mask structure, a titanium oxide film 36 is also formed on a section of a mask where an X-ray absorber 33 lies (namely, within the exposure area). The titanium oxide film 36 is formed by sputtering using a mesh or the like, whereby its growth is given a directional property. Therefore, the titanium oxide film 36 is not formed on the side of the X-ray absorber 33, and the linewidth can be easily controlled by the X-ray absorber 33.

<Sixth Embodiment>

Figure 6:
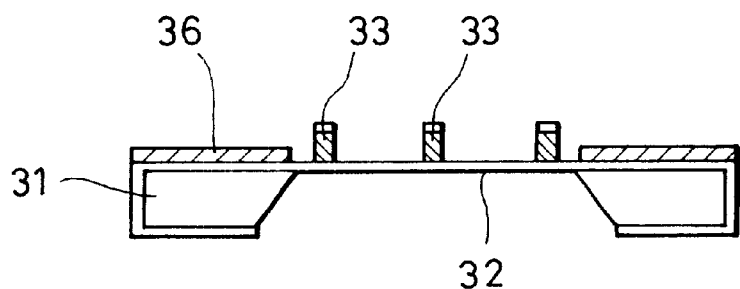
FIG. 6 is a cross-sectional view showing the configuration of a mask structure according to a sixth embodiment of the present invention.

FIG. 6 is a cross-sectional view of a mask structure according to a sixth embodiment of the present invention.

This mask structure is an X-ray mask structure that is suitable for X-ray exposure.

This X-ray mask structure comprises a holding frame 31 having a thickness of 2 mm and made of Si, an X-ray transmissive support film 32 made of SiC and having a thickness of 2.0 μm, which is held by the holding frame 31 and formed by CVD, and an X-ray absorber 33 formed of a gold (Au) film that is formed in a desired pattern on the support film 32 by plating. If desired, a reinforcing member (not shown) may be bonded to the holding frame 31. The reinforcing member, which is denoted by reference numeral 34 in FIGS. 4 and 5, may be omitted, if it is not necessary. A resist that has been used in forming the X-ray absorber 33 is stripped after a titanium oxide film 36 is formed, whereby titanium oxide remains only on the X-ray absorber 33 inside the exposure area. The titanium oxide film 36 is also formed on the periphery of the mask (i.e., outside the exposure area) in a manner similar to the fourth embodiment. Such a configuration prevents the contrast from being lowered due to attenuation of X-rays resulting from absorption by the titanium oxide.

<Seventh Embodiment>

Figure 7:
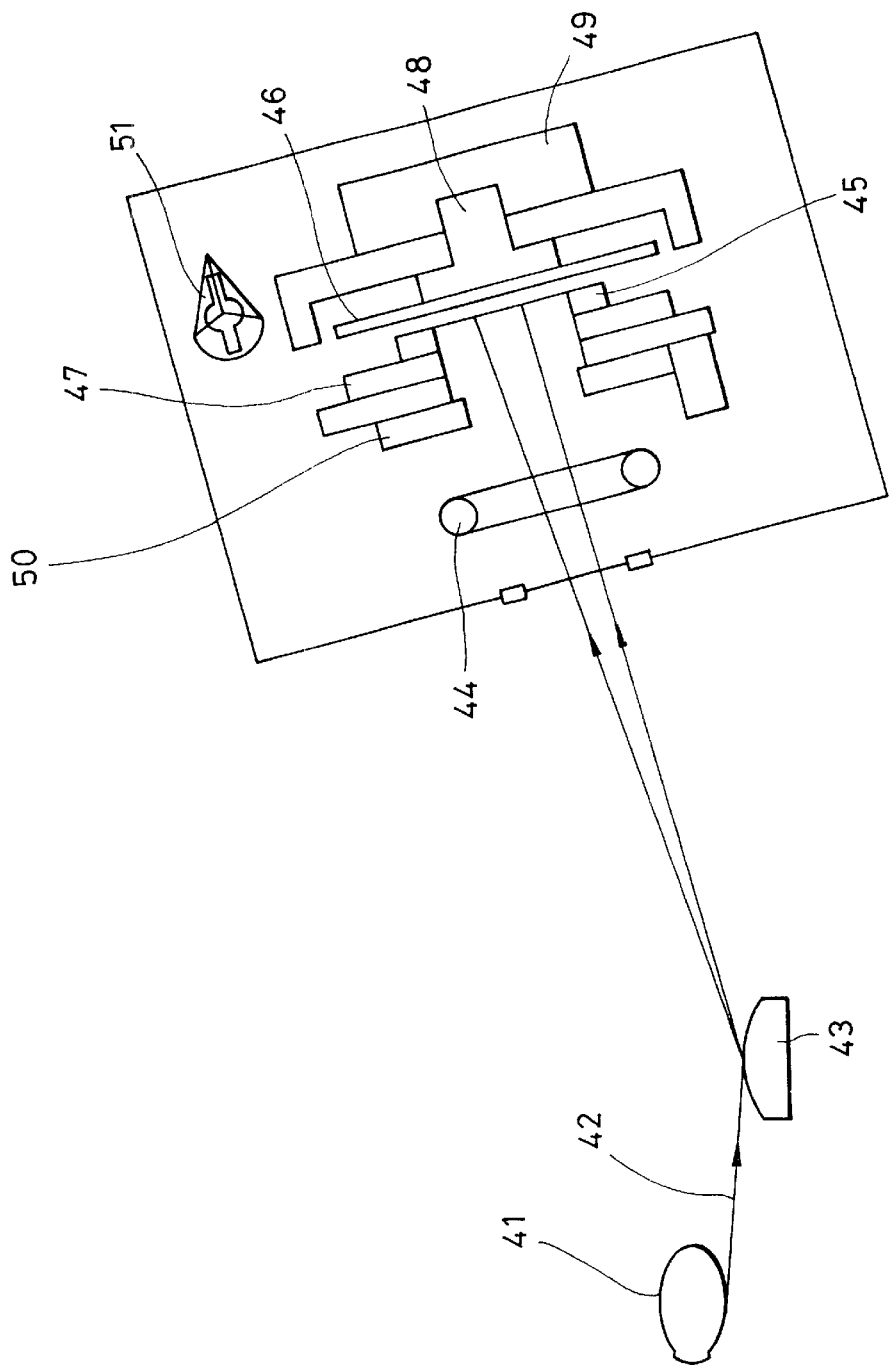
FIG. 7 is a schematic structural view showing the principal part of an X-ray exposure apparatus according to a seventh embodiment of the present invention.
Figure 8:
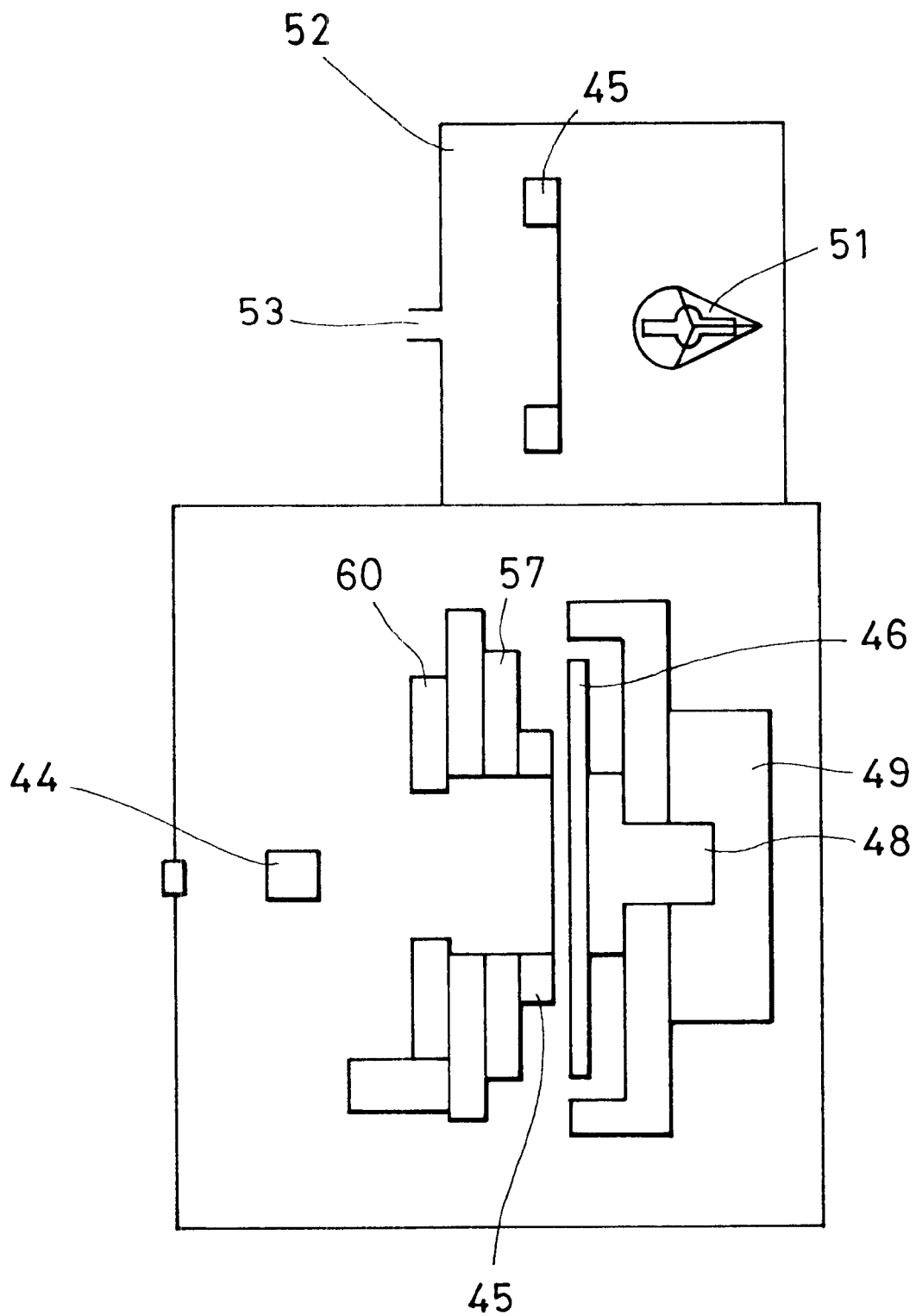
FIG. 8 is a top view of the X-ray exposure apparatus shown in FIG. 7.

A description will now be given of an X-ray exposure apparatus for use in manufacturing microminiature devices (e.g., semiconductor devices, thin-film magnetic heads, and micromachines) by using the mask structure described in the above embodiments. FIG. 7 is a schematic structural view showing the principal part of an X-ray exposure apparatus according to a seventh embodiment of the present invention, and FIG. 8 is a top view of the X-ray exposure apparatus. This X-ray exposure apparatus uses a synchrotron radiation (SR) source as an X-ray source.

Synchrotron radiation light 42 emitted from an SR source (storage ring) 41 takes the shape of a sheet beam that spreads in the lateral direction (i.e., the direction in the orbital plane of the SR source 41) so that its light intensity is almost uniform, and that it hardly spreads in the transverse direction. The synchrotron radiation light 42 is reflected by a convex mirror 43 formed by a cylindrical mirror, and is thereby enlarged transversely and turned into a beam having an almost rectangular cross section, whereby a rectangular exposure area is provided. The synchrotron radiation light 42, which has been enlarged, is controlled by a shutter 44 so that the exposure within the radiation area is uniform. The synchrotron radiation light 42 passed through the shutter 44 is directed to an X-ray mask 45. The X-ray mask 45 may be a mask structure according to any of the above-mentioned first to sixth embodiments. The X-ray mask 45 is attracted by vacuum, for example, onto a mask stage 47 and is held opposed to a wafer 46 that serves as a material to be patterned (i.e., to be exposed). Although the X-ray mask 45 may undergo exposure with a pellicle mounted thereon, the pellicle is not shown in these figures.

The wafer 46 is held on a wafer chuck 48 that is mounted on a wafer stage 49. In order to position the wafer 46, the wafer stage 49 is moved.

An alignment unit 50 comprises an optical system for detecting alignment marks that are formed for positioning on the X-ray mask 45 and the wafer 46, and an arithmetic unit for calculating an offset between the X-ray mask 45 and the wafer 46. The X-ray mask 45 of the present invention permits high-accuracy positioning.

After the X-ray mask 45 and the wafer 46 are aligned with each other, a pattern formed on the X-ray mask 45 is transferred onto the wafer 46 by radiating the synchrotron radiation light 42, which is shaped into a rectangular beam, in a step-and-repeat manner or a scanning manner.

An auxiliary light source 51, such as a mercury lamp or a black light, is disposed in the vicinity of the mask stage 47. Auxiliary light is radiated from the auxiliary light source 51 to the X-ray mask 45 without affecting the wafer 46 and the resist thereon.

In the X-ray exposure apparatus having such a configuration, the decomposition and antistatic functions of the titanium oxide film on the mask or the pellicle are promoted during exposure using the synchrotron radiation light 42 (i.e., in a case in which a titanium oxide film is formed in the exposure area) or radiation of the auxiliary light. This avoids the adhesion of dust or the like to the mask and the pellicle.

In the X-ray exposure apparatus, a mask cassette 52 for storing unused masks also includes an auxiliary light source 51, as shown in FIG. 8. This auxiliary light source 51 permits the titanium oxide film of the stored X-ray mask to decompose deposits. Decomposed products may be collected through an exhaust vent 53 of the mask cassette 52.

This X-ray exposure apparatus achieves high-accuracy X-ray exposure, which is suitable for mass production.

<Eighth Embodiment>

Figure 9:
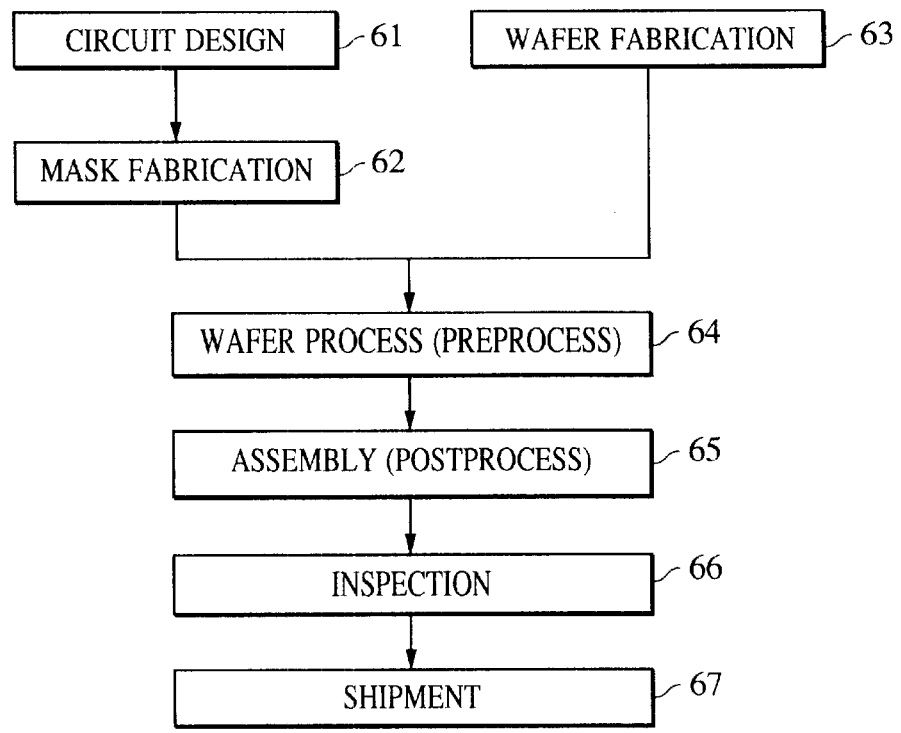
FIG. 9 is a flowchart showing a procedure for manufacturing a semiconductor device according to an eighth embodiment of the present invention.

A description will now be given of a method of manufacturing a semiconductor device by using the exposure apparatus mentioned above. FIG. 9 is a flowchart showing a procedure for manufacturing a semiconductor device (e.g., a semiconductor chip such as an IC or an LSI, a liquid crystal panel, a CCD, or the like).

In Step 61 (circuit design), a circuit pattern of a semiconductor device is designed. In Step 62 (mask fabrication), a mask structure having the designed circuit pattern formed thereon is fabricated according to the first to sixth embodiments mentioned above. On the other hand, in Step 63 (wafer fabrication), a wafer is fabricated by using a material such as silicon.

In Step 64 (wafer process), called a preprocess, an actual circuit is formed on the wafer by X-ray lithography using the mask structure prepared in Step 62 and the wafer prepared in Step 63. In Step 65 (assembly), called a postprocess, a semiconductor chip is manufactured by using the wafer having the circuit formed thereon in Step 64, and an assembly process (e.g., dicing, bonding), a packaging process (chip sealing) and the like are included in this step. In step 66 (inspection), the semiconductor device manufactured in Step 65 is subjected to a performance test, an endurance test, and the like. The semiconductor device is completed through these steps, and then shipped (Step 67).

Figure 10:
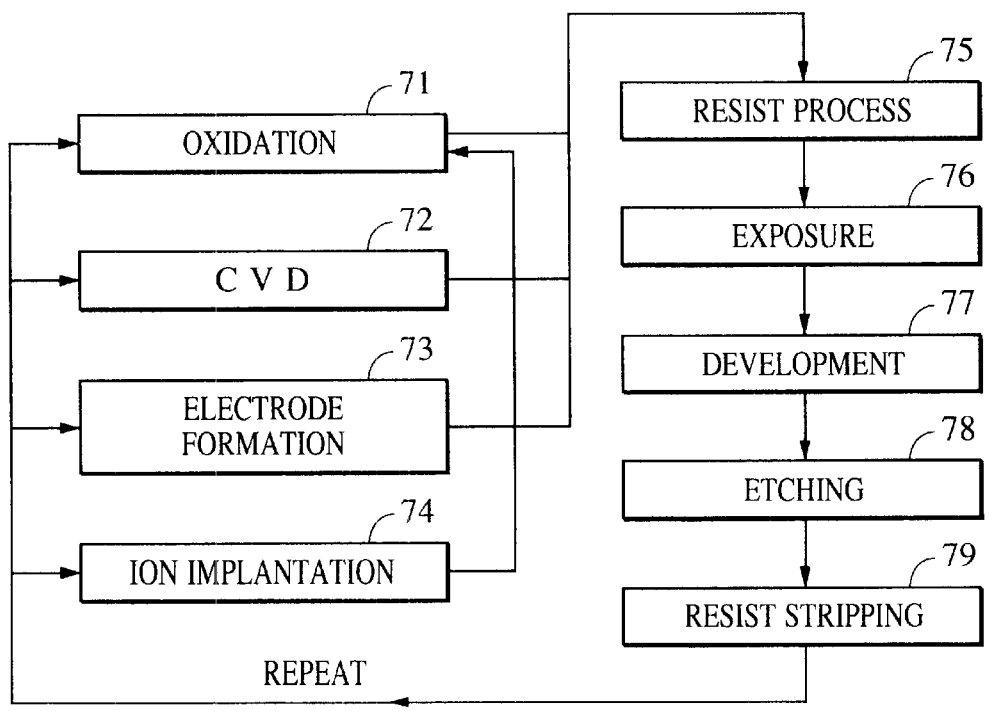
FIG. 10 is a detailed flowchart of a wafer process in the semiconductor device manufacturing procedure shown in FIG. 9.

FIG. 10 is a detailed flowchart of the aforementioned wafer process in Step 64.

In Step 71 (oxidation), the surface of the wafer is oxidized. In Step 72 (CVD), an insulating film is formed on the surface of the wafer by CVD. In Step 73 (electrode formation), electrodes are formed on the wafer by evaporation. In Step 74 (ion implantation), desired ions are implanted into the wafer. In Step 75 (resist process), a chemically amplified resist is applied on the wafer.

In Step 76 (exposure), the circuit pattern of the mask structure is printed on the wafer though exposure by the X-ray exposure apparatus described in the seventh embodiment. The wafer is loaded so that it opposes the mask. The offset between the wafer and the mask is detected by the alignment unit, and the wafer and the mask are positioned by moving the wafer stage. When the wafer and the mask are aligned with each other, exposure is performed. After the completion of exposure, the wafer is stepped to the next shot, and alignment and subsequent operations are repeated.

In Step 77 (development), the wafer exposed in Step 76 is developed. In Step 78 (etching), parts other than the developed resist are cut away. By repeating these steps, multiple circuit patterns are formed on the wafer.

The manufacturing method of this embodiment can respond to mass production of highly integrated semiconductor devices that have before been difficult to manufacture.

While the embodiments of the present invention have been described, centered on the manufacture of a semiconductor device using X-ray exposure, it is to be understood that the present invention is not limited to the disclosed embodiments. The present invention may be applied to an exposure method or apparatus that performs exposure with a mask and a resist placed close to each other, and a mask structure used in the method or apparatus. Namely, the present invention is intended to cover an exposure method and an apparatus and a mask structure that use light other than X-rays (e.g., ultraviolet light or far-ultraviolet light from a light source such as an excimer laser) as long as the light has a wavelength in a region that permits titanium oxide to function as a photocatalyst. Or, the present invention is intended to cover an exposure method and apparatus and a mask structure that use energy beams other than X-rays (e.g., light mentioned above, an electron beam, or an ion beam) on a condition that auxiliary light is used.

As mentioned above, in the mask structure of the present invention, a thin film of titanium oxide is formed on the surface of a mask or on a pellicle mounted on a mask (in forming the titanium oxide thin film on the surface of a mask itself, it is preferable that the film not be formed in the exposure area or on the side of an absorber), so that the titanium oxide serves as a photocatalyst and provides an antistatic function when being made electroconductive. This makes it possible to prevent the surfaces of the pellicle and the mask from being contaminated, to reduce the number of times of cleaning, or to eliminate the need for cleaning altogether, thereby extending the life of the mask.

Furthermore, an exposure method and apparatus, in which a pattern is transferred onto a material to be patterned by exposure using this mask structure, achieves high-accuracy printing that is suited for mass production. Still further, high-performance semiconductor devices can be mass-produced by transferring a pattern onto a substrate by exposure using the mask structure of the present invention, and processing the substrate.

Except as otherwise disclosed herein, the various components shown in outline or in block form in the Figures are individually well known and their internal construction and operation are not critical either to the making or using of this invention or to a description of the best mode of the invention.

What is claimed is:

1. A mask structure comprising:
   a mask for use in transferring a desired pattern onto a substrate by exposure;
   a pellicle positioned to cover at least one of a patterned surface of said mask and a surface of said mask opposite to the patterned surface; and
   a titanium oxide film formed only outside an exposure area on the surface of said pellicle.

2. A mask structure according to claim 1, wherein said mask is a reflective-type mask.

3. A mask structure according to claim 1, wherein said mask is a transmission mask.

4. A mask structure according to claim 1, wherein said titanium oxide film is formed on a section of the surface of said pellicle other than a section where light is radiated when the substrate is exposed.

5. A mask structure according to claim 1, wherein said mask structure is used for exposure using X-rays.

6. A mask structure comprising:
   a mask for use in transferring a desired pattern onto a substrate by exposure, said mask having an exposure area to be irradiated with an energy beam; and
   a titanium oxide film formed on the surface of said mask, said titanium oxide film being formed outside the exposure area, except for a portion where the pattern exists.

7. A mask structure according to claim 6, wherein the energy beam includes X-rays.

8. A mask structure, comprising:
   a mask for use in transferring a desired pattern onto a substrate, said mask including an exposure area to be irradiated with an energy beam, and an absorber pattern for the energy beam formed on the exposure area; and
   a titanium oxide film formed on said mask, said titanium oxide film being formed, except for a portion where the absorber pattern exists, outside the exposure area and only on the upper surface of said absorber pattern.

9. A mask structure according to claim 8, wherein the energy beam includes X-rays.

10. A mask structure comprising:
    a mask for use in transferring a desired pattern onto a substrate by exposure, said mask having an exposure area to be irradiated with an energy beam including the pattern, and a reflection energy beam from said exposure area being used for the transferring;
    a pellicle positioned to cover at least said exposure area; and
    a titanium oxide film formed on the surface of said pellicle.

11. A mask structure according to claim 10, wherein the energy beam includes X-rays.

* * * * *

UNITED STATES PATENT AND TRADEMARK OFFICE
CERTIFICATE OF CORRECTION

PATENT NO. : 6,337,161  
DATED : January 8, 2002  
INVENTOR(S) : Keiko Chiba et al.

Page 1 of 1

It is certified that error appears in the above-identified patent and that said Letters Patent is hereby corrected as shown below:

<u>Title page,</u>  
In the title, "MASK STRUCTURE EXPOSURE MEHTOD" should read -- MASK STRUCTURE FOR USE IN AN EXPOSURE METHOD --.

<u>Column 1,</u>  
Line 1, MASK STRUCTURE EXPOSURE METHOD" should read -- MASK STRUCTURE FOR USE IN AN EXPOSURE METHOD--.

<u>Column 12,</u>  
Line 43, "step" should read -- Step --.  
Line 58, "though" should read -- through --.

<u>Column 14,</u>  
Line 28, "formed" should read -- formed only --.

Signed and Sealed this

Eleventh Day of June, 2002

*Attest:*

JAMES E. ROGAN  
*Attesting Officer*   *Director of the United States Patent and Trademark Office*